(12) United States Patent
Chen et al.

(10) Patent No.: US 8,749,293 B2
(45) Date of Patent: Jun. 10, 2014

(54) STACKABLE PROGRAMMABLE PASSIVE DEVICE AND A TESTING METHOD

(75) Inventors: Fen Chen, Williston, VT (US); Douglas D. Coolbaugh, Essex Junction, VT (US); Baozhen Li, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 229 days.

(21) Appl. No.: 13/529,557

(22) Filed: Jun. 21, 2012

(65) Prior Publication Data

US 2012/0261724 A1    Oct. 18, 2012

Related U.S. Application Data

(63) Continuation of application No. 11/161,932, filed on Aug. 23, 2005.

(51) Int. Cl.
*G06G 7/19* (2006.01)
*H01L 29/00* (2006.01)

(52) U.S. Cl.
USPC ............ 327/337; 327/594; 257/528; 257/529

(58) Field of Classification Search
USPC .......... 257/529, 528; 333/28 R; 327/337, 594
See application file for complete search history.

(56) References Cited

U.S. PATENT DOCUMENTS

| | | |
|---|---|---|
| 3,125,716 A | 3/1964 | Machlis |
| 5,394,294 A | 2/1995 | Mei et al. |
| 5,625,361 A | 4/1997 | Garrity et al. |
| 5,648,791 A | 7/1997 | Date et al. |
| 5,659,182 A | 8/1997 | Cohen |
| 5,852,415 A | 12/1998 | Cotter et al. |
| 6,288,669 B1 | 9/2001 | Gata |
| 6,677,637 B2 | 1/2004 | Bernstein et al. |
| 6,686,790 B2 | 2/2004 | Cutter et al. |
| 6,686,809 B2 | 2/2004 | Nystrom et al. |
| 6,759,257 B2 | 7/2004 | McCormack et al. |
| 6,914,811 B2 | 7/2005 | Muller |
| 7,177,134 B2 | 2/2007 | Ikehashi et al. |
| 2001/0013632 A1 | 8/2001 | Richiuso |
| 2002/0093780 A1 | 7/2002 | Hajimiri et al. |
| 2003/0137356 A1 | 7/2003 | Kappes et al. |
| 2004/0085120 A1 | 5/2004 | Pitts |
| 2005/0030265 A1 | 2/2005 | Miyagawa |

*Primary Examiner* — Lincoln Donovan
*Assistant Examiner* — Colleen O Toole
(74) *Attorney, Agent, or Firm* — Anthony Canale; Roberts Mlotkowski Safran & Cole, P.C.

(57) ABSTRACT

A programmable passive device comprising a first node and a second node. A plurality of passive device elements electrically coupled to the first node. A plurality of switches are electrically coupled to at least the second node and selectively coupled to a number of the plurality of passive device elements to provide the programmable passive device with a pre-determined value.

16 Claims, 10 Drawing Sheets

Stacked VPP Bank $C_{Bank\,1} = C_{Bank\,2} = N*C_{Block}$ $C_{total} = 1/n*C_{Bank}$ in series and $C_{total} = n*C_{Bank}$ in parallel (Pad 1 - G & Pad 2 - Force)    (Pad 3 - G & Pad 1 & 2 - Force)

STACKABLE PROGRAMMABLE PASSIVE DEVICE AND A TESTING METHOD

CROSS REFERENCE TO RELATED APPLICATIONS

The present application is a continuation application of co-pending U.S. application Ser. No. 11/161,932, filed on Aug. 23, 2005, the contents of which are incorporated by reference in its entirety herein.

FIELD OF THE INVENTION

The invention generally relates to programmable passive devices, and more particularly to stackable programmable vertical parallel plate capacitors or other passive devices and testing method.

BACKGROUND DESCRIPTION

Manufacturing of high performance mixed-mode and radio frequency (RF) CMOS and BiCMOS circuits require high performance passive capacitors with high reliability, high capacitance, and low cost (high manufacturing yield). These three factors can be traded off and are dependent on capacitor geometries. New CMOS technologies offer many options for incorporation of BEOL as well as FEOL passive devices into standard CMOS and BiCMOS to improve circuit integration and performance. For example, high-performance capacitors such as the vertical-parallel plate (VPP) capacitor are suitable for mixed-mode and RF applications.

VPP capacitors use combinations of single level metal capacitor with comb-comb or interdigitated comb-serpentine configurations to boost the capacitance value and density. Vias are used to link multiple metal levels together, and these linked vertical parallel capacitor structures significantly increase the capacitance value but still maintain relative small capacitor's surface area. The overall capacitance of the VPP can be increased by layout optimization.

Figure 5:
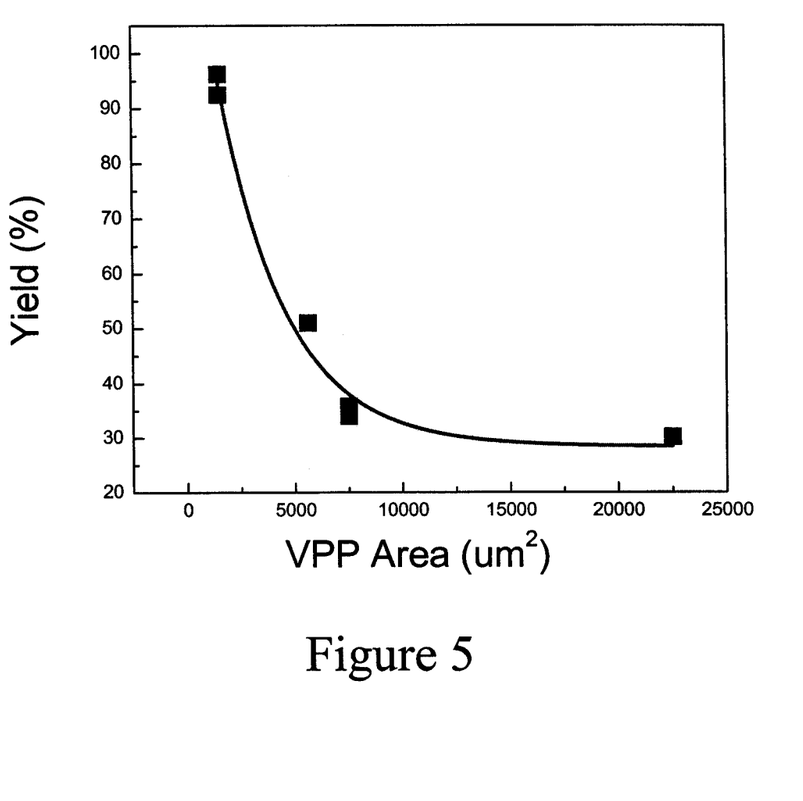
FIG. 5 is a graph illustrating yield vs. area of various capacitor sizes.

Manufacturability and cost of quality on chip passive devices are essential to the development of high performance SiGe RF technologies. The VPP capacitor is very promising compared to other capacitor choices due to its relatively low manufacturing cost and simple integration. For the maximum chip performance, the large VPP capacitor (>10E6 $\mu m^2$ surface area) with large capacitance is required. However, such large capacitor may be exposed to the risks of low yield and high reliability concern. (This is shown in FIG. 5.)

SUMMARY OF THE INVENTION

In a first aspect of the invention, a programmable passive device comprises a first node and a second node. A plurality of passive device elements are electrically coupled to the first node. A plurality of switches are electrically coupled to at least the second node and selectively coupled to a number of the plurality of passive device elements to provide the programmable passive device with a pre-determined value.

In another aspect of the invention, a programmable passive device comprises a common node and at least one further node. A first bank and second bank of passive device elements are electrically coupled to the common node. A plurality of switches is associated with each of the passive device elements of the first bank and the second bank. The plurality of switches are selectively coupled to at least one of the passive device elements of at least one of the first bank and the second bank and at least one further node to provide a pre-determined capacitance value.

In another aspect of the invention, a method comprises connecting all VPP blocks through a top bus to form a large VPP bank and providing a chip capacitance comparison or external capacitance check for individual VPP blocks. The method further includes turning off or blowing a fuse if a bad VPP block is found. In embodiments, the method further includes comparing a total capacitance of the connected VPP blocks to a target value and if the total capacitance and target value are not the same, the method trims parallel connected back-up VPP blocks out or serial connected back-up banks.

DETAILED DESCRIPTION OF EMBODIMENTS OF THE INVENTION

The invention relates to programmable passive devices such as capacitors, inductors, resistors or the like. More particularly, the invention relates to stackable programmable vertical parallel plate (VPP) capacitors or other passive devices such as, for example, resistors and inductors, and a testing method. In one embodiment of the invention, two or more VPP capacitors (or other passive devices) may be linked together by a switching device, e.g., fuse or switch, to provide increased reliability, performance and yield of devices such as, for example, RF devices. By using two or more smaller area sized VPP capacitors, e.g., 1,500 $\mu m^2$, linked together instead of one single larger area sized capacitor, e.g., 22,500 $\mu m^2$, the time to failure of the device is significantly increased, i.e., the device is more robust. By switching connectivity of the capacitors, the capacitance value (or other value when using other passive devices) can be tuned and/or programmed, increasing the flexibility of the device.

As one illustrative example, using a switching device between several vpp capacitors, it is possible to adjust the capacitance properties of a bank of VPP capacitors by forming parallel or serial connections between stackable banks of the same or different area sized VPP capacitors. In the invention, the capacitance properties can be fine tuned after the buildup of the device, in the field.

Figure 1:
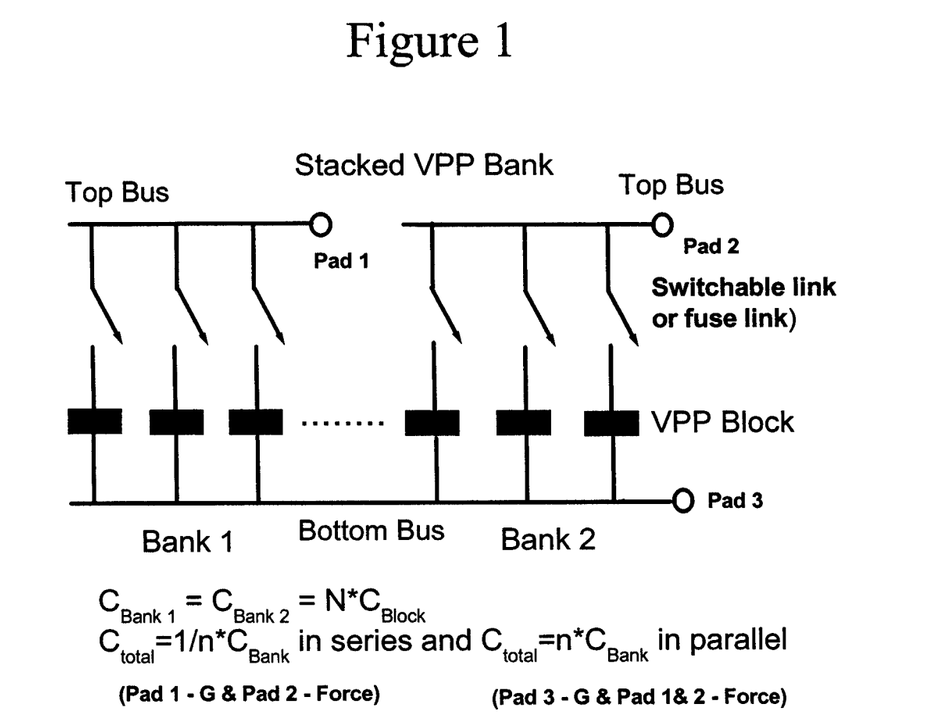
FIG. 1 illustrates a representative embodiment in accordance with the invention.
Figure 2:
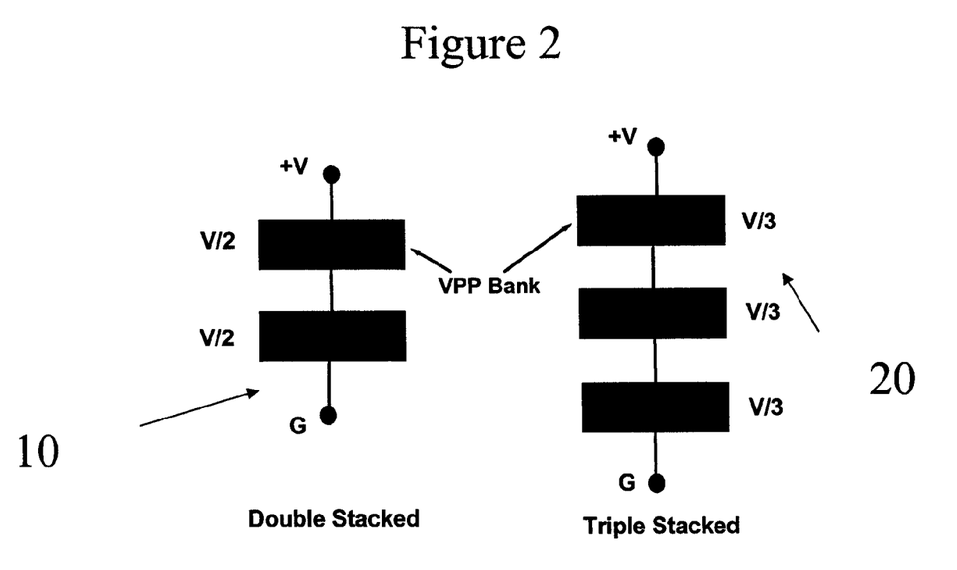
FIG. 2 illustrates stackable configurations of vertical parallel plate (VPP) capacitor banks in accordance with the invention.

Referring to FIGS. 1 and 2, in order to overcome large area related VPP yield loss and reliability problems, a VPP on-chip programmable bank configuration is provided. This configuration replaces a conventional single large VPP. In one example, the area size of the VPP capacitor may be approximately 1,500 μm², although other sizes are also contemplated by the invention. The smaller area sized VPP capacitors may be filled in all empty chip space as individual blocks and connected together to form a large VPP capacitor. In the illustrative embodiment, each single VPP block has its own on-chip switchable resistor connection or laser/electrical fuse.

Figure 7:
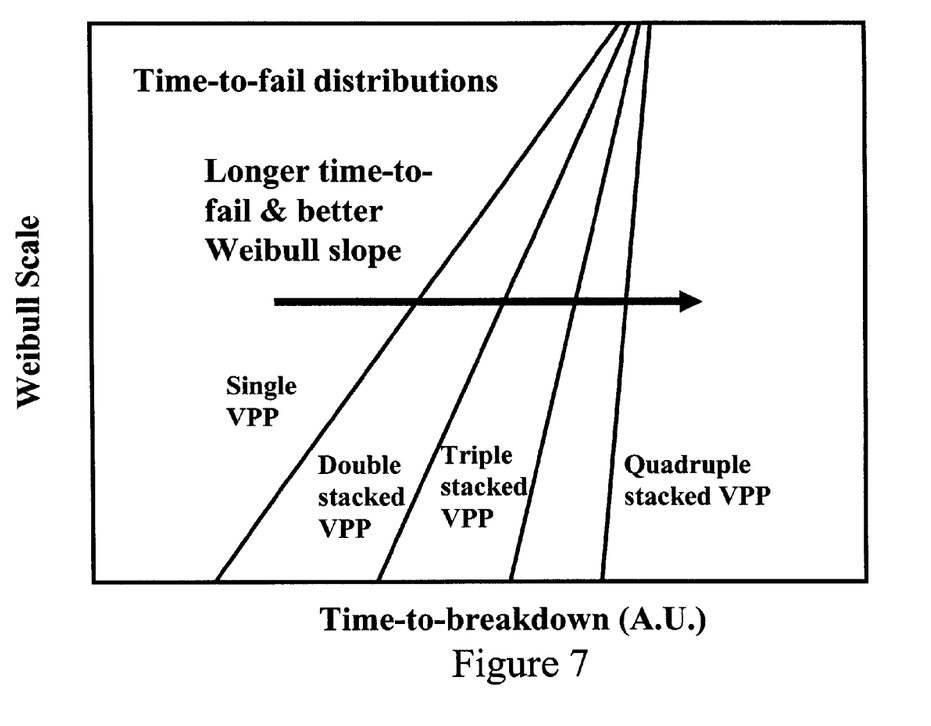
FIG. 7 is a graph illustrating a failure distribution for various successive breakdown times for various number stacked VPPs.

In order to minimize the reliability risk, the large VPP bank may be stacked together to share the total applied electrical field. For such stacked approach, not only the actual electrical field on each VPP block will be divided, but also the performance (total capacitance will be increased after one VPP bank fails) and the reliability margin will be enhanced. As the stacked structure can tolerate two or three breakdowns, if not more, the time to failure of stacked VPP can now be determined by the second or the third breakdown times (longer time-to-fail), therefore, both the breakdown time statistical distribution (successive breakdown statistics) and overall time-to-fail will be significantly improved as shown in FIG. 7.

More specifically, FIG. 1 illustrates an example of an embodiment of the invention. The structure of FIG. 1 includes two banks of capacitors, bank 1 and bank 2, each having three VPP blocks, electrically connected to a common bottom bus. The common bus is electrically connected to a pad 3. Although FIG. 1 shows two banks of capacitors, each having three VPP blocks, it should be understood by those of skill in the art, that more or less than one bank of VPP blocks, with any number and appropriate sized VPP blocks suited for a particular application or design criteria, is also contemplated by the invention.

Still referring to FIG. 1, the bank 1 set of VPP blocks is connectable with a top bus by a corresponding number of switchable links or fuse links, one such embodiment being described in greater detail below. The top bus is in electrical communication with pad 1. Similarly, the bank 2 set of VPP blocks is connectable with a top bus by a corresponding number of switchable links or fuse links. The top bus associated with bank 2 is in electrical communication with pad 2. In the illustrative example of FIG. 1, the capacitance value of bank 1 is equal to the capacitance value of bank 2 by the virtue of the same number and sized VPP blocks used in each bank; however, it should be understood that other values and configurations are also contemplated by the invention.

By way of one illustration shown in FIG. 1, $$C_{Bank1}=C_{Bank2}=N*C_{BLOCK}, \text{ where,}$$

$C_{Bank1}$ is the capacitance value of the blocks in bank 1,
$C_{Bank2}$ is the capacitance value of the blocks in bank 2,
"N" is the number VPP blocks for each bank, and
"$C_{BLOCK}$" is the capacitance value for each VPP block.

However, when a different number of VPP blocks or different sized VPP blocks are associated with any of the banks, the equation reduces to $C_{Bank}=N*C_{BLOCK}$.

By way of further illustration, using the example of FIG. 1, by grounding pad 1 and biasing pad 2, the resultant capacitance configuration will be in serial connection. This can be represented by the following equation:

$$C_{total}=1/n*C_{Bank}.$$

By grounding pad 3 and biasing pad 1 and pad 2, the resultant capacitance configuration will be in parallel connection. This can be represented by the following equation:

$$C_{total}=n*C_{Bank}.$$

With these examples, as should be understood by those of skill in the art, the capacitance value of the device can now be programmed by biasing and grounding certain pads in order to achieve serial and/or parallel connections between the banks of VPP blocks. Also, by using different combinations of connections, area sizes of capacitors, different links via the switches and/fuses, stacking VPP banks, and combinations thereof, it is possible, in accordance with the invention, to provide added flexibility to the device, via the capability of adjusting or programming the capacitance values, to certain design parameters.

It should be further understood that the invention is not limited to the adjustment or programmability of VPP capacitors. The use of capacitors is only one non-limiting illustratively embodiment. Accordingly, within the spirit of this invention, other passive devices such as, for example, resistors, inductors, etc. may also be stacked and linked using the same inventive concepts described herein.

FIG. 2 illustrates a stackable configuration in accordance with the invention. In FIG. 2, a double stack 10 and a triple stack 20 of VPP blocks are shown in serial connection. The stackable configuration provides flexibility to the device, by allowing any number stacks to be configured for certain design parameters.

Figure 3:
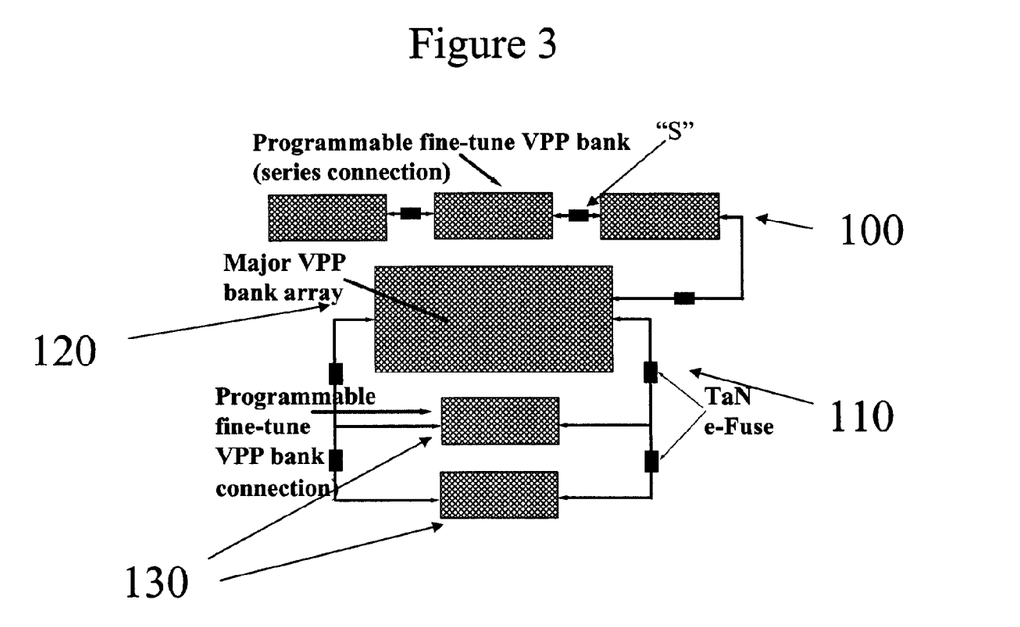
FIG. 3 is a pictorial representation of a fine-tuning of the stackable programmable VPP capacitors in accordance with the invention.

FIG. 3 is one configuration for providing a certain programmability of the capacitors in accordance with the invention. The structure of FIG. 3 represents three programmable fine-tune VPP banks 100 connected in series, via switches "S". In this configuration, the three programmable fine-tune VPP banks 100 have a same capacitance value, although it is contemplated that such values may vary depending on particular design parameters. This may be accomplished by different numbers and/or sizes of VPP blocks in each bank, for example. The three programmable fine-tune VPP blocks are connected in series with a second set of VPP banks 110, arranged in parallel. In the second set of VPP banks 110, a major VPP bank array 120 is connected in parallel to two smaller VPP banks 130. The connections of the second set of VPP banks may be made via a TaN e-fuse, but other fuses such as Tungsten Nitride and Titanium Nitride are also contemplated for use with the invention.

In the configuration of FIG. 3, any of the fuses may be blown, in the field, to adjust the capacitance value of the design. This may be accomplished by sending a current through the device, which exceeds a threshold of one or more of the links, e.g., fuses. This will blow the fuse and thus change the capacitance value of the device. Also, other configurations can also be designed such as, for example, more than three VPP banks connected in series or the like. Using the equations above, it is readily ascertainable by those of skill in the art, that many different capacitance values can be programmed in accordance with the invention, while significantly improving yield and reliability to achieve a desired result.

Figure 4:
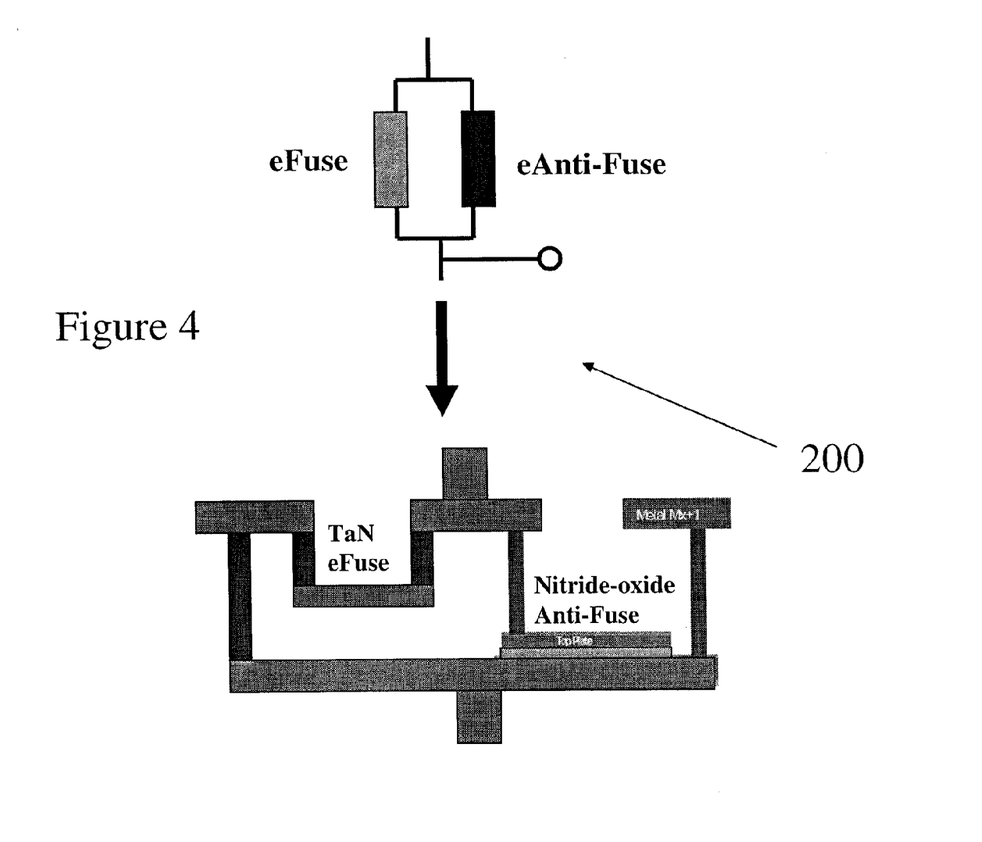
FIG. 4 shows a switchable fuse or link configuration used in accordance with the invention.

FIG. 4 represents a switchable link 200 used in accordance with the invention. The switchable link 200 includes an e-fuse and an e-anti-fuse connected in parallel. The e-fuse may be, for example, TaN and the e-anti-fuse may be made from a metal/Nitride-oxide (NO)/metal capacitor. This configuration of FIG. 4 offers a second time programmability; that is, the fuses can be programmed at different currents and voltage levels, thus providing added flexibility to the device, in accordance with the invention.

By way of one illustrative non-limiting example, the e-fuse may be closed before programming and opened post programming; whereas, the e-anti-fuse may be opened before programming and closed post programming. Using such example, one program may open the e-fuse at a lower bias and another program may close the e-anti-fuse by blowing the fuse at a higher bias. In this manner, two sets of programming levels can be accomplished using the invention.

FIG. 5 is a graph illustrating yield vs. area of various capacitor sizes. As shown by the experimental data of FIG. 5, the yield of the device increases significantly as the VPP block size decreases. For example, the yield is close to 100% at a VPP capacitor size of 1,500 $\mu m^2$; whereas, a capacitor size of 22,500 500 $\mu m^2$ may result in a yield of approximately 25%. In the invention, although any of the capacitor size is contemplated, in accordance with the invention, several smaller sized capacitor connected in series or parallel are provided, instead of a single larger sized capacitor. The connectivity of several smaller sized VPP capacitors effectively results in a capacitance value of a larger VPP capacitor. In the invention, yield is defined as leakage<100 nA @ 5V.

Figure 6:
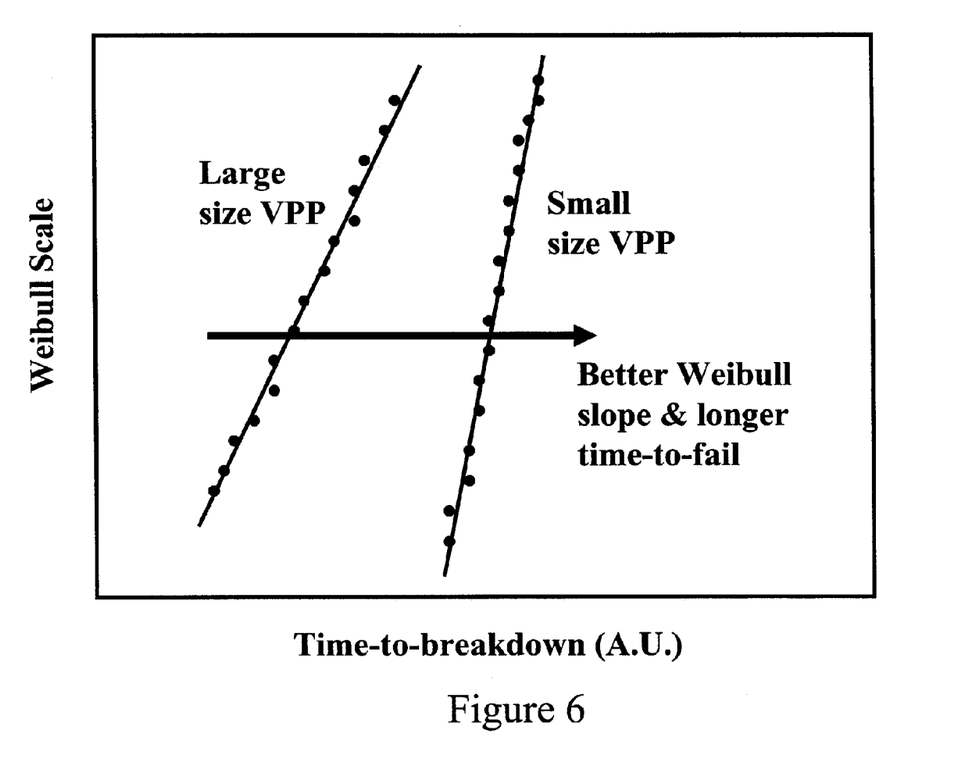
FIG. 6 is a graph illustrating reliability Weibull plot for two VPP capacitors with different sizes in accordance with experimentations.

FIG. 6 is a graph illustrating reliability Weibull plot for two VPP capacitors with different sizes.

As shown in FIG. 6, the reliability of the capacitor, and hence any device, increases as the size of the capacitor decreases. Thus, by using smaller capacitors linked together, an approximate 100% yield and reliability is achieved in accordance with the invention, while still providing the benefits of a larger sized capacitor.

FIG. 7 is a graph illustrating a fail distribution for various number stacked VPP capacitors. The graph of FIG. 7 is a Weibull scale with TBD representing the time to breakdown. In FIG. 7, each data point is representative of a breakdown time from each VPP block. As shown in FIG. 7, the time to failure increases in each successive distribution $1^{st}$, $2^{nd}$, $3^{rd}$, $4^{th}$ etc. For a single capacitor, and double, triple, and quadruple stacked capacitors. This is represented by the increased or steeper slope of each line representing successive distributions. Thus, it is shown in FIG. 7 that there is significant reduction of the failure rate due to improved beta and increased time-to-breakdown with successive breakdown statistics of the stacked approach.

The following equations numerically show the relations of the above graphs. These equations can also be used to calculate the optimal configuration, e.g., longest time to failure.

$$\beta_k = k \cdot \beta_1$$
$$\beta_k = k \cdot \beta_1$$
$$S = k \ln \frac{A_s}{A_p}$$
$$S = k \ln \frac{A_s}{A_p}$$
$$t_{63\text{-}use} = (t_{63\text{-}1st} + t_{k\text{-}delay}) \times e^{[\gamma(V_{stress} - V_{use}/k)]} t_{63\text{-}use} =$$
$$(t_{63\text{-}1st} + t_{k\text{-}delay}) \times e^{[\gamma(V_{stress} - V_{use}/k)]}$$

$\beta_k$ is the fail point distribution, k is the number of stacked VPP capacitors, $\beta_1$ is the time of failure for a single VPP capacitor, S is the area scaling, $A_s$ is the total area of a stressed VPP capacitor, $A_p$ is the total area of a real product, $t_{63\text{-}use}$ is the median time to fail at usage conditions, $t_{63\text{-}1st}$ is the time to fail for a first and last VPP capacitor in a stack, $t_{k\text{-}delay}$ is the time to fail based on a delay (time difference between number of stacked VPP capacitors), $\gamma$ is a voltage acceleration factor, $V_{stress}$ is voltage at stress level, and $V_{use}$ is voltage at use condition.

Figure 8:
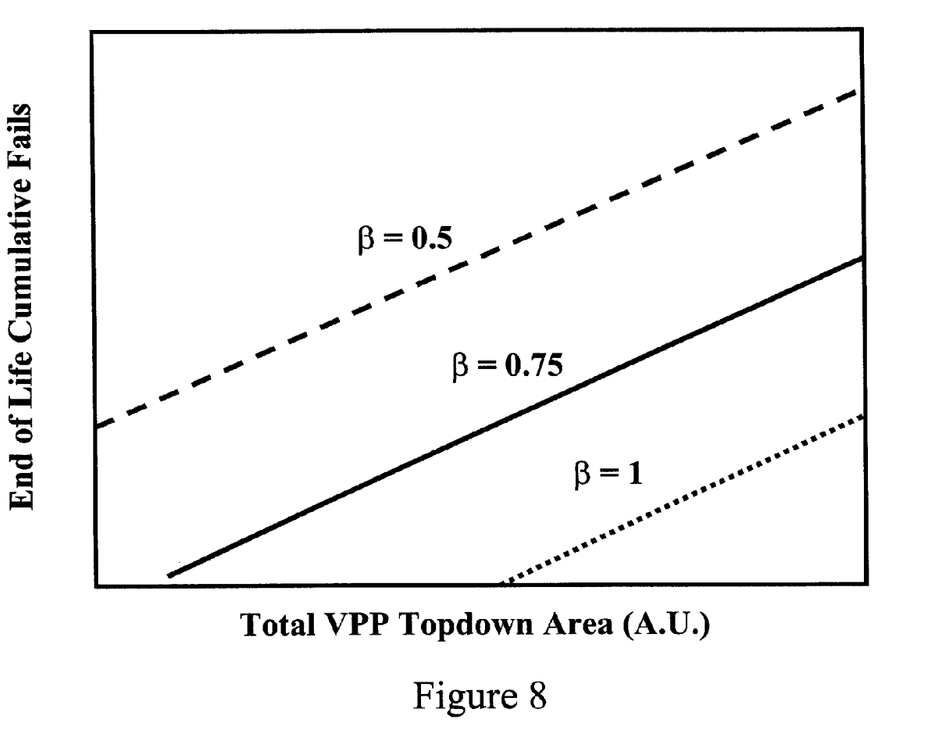
FIG. 8 is a graph illustrating a cumulative failure rate at the device end of life based on Weibull slope (beta) effect.
Figure 9:
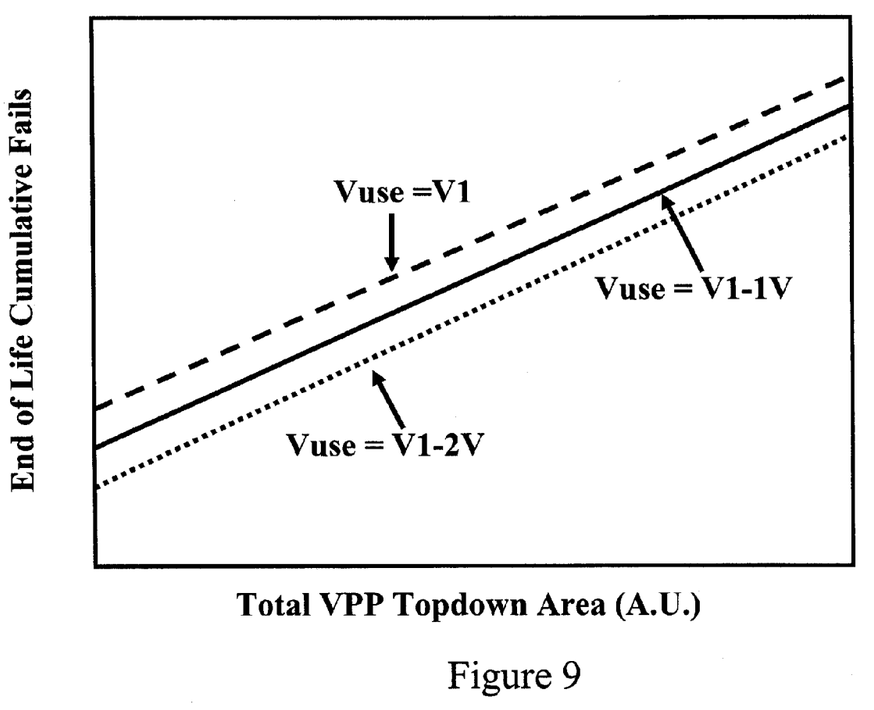
FIG. 9 is a graph illustrating a cumulative failure rate at the device end of life based on voltage effect.

FIG. 8 is a graph illustrating a time to failure based on beta effect and FIG. 9 is a graph illustrating a time to failure based on voltage effect. As shown in FIG. 8, for example, the end of life accumulated failure rate increases as the beta decreases. Also, as shown in FIG. 9, a voltage effect is also a contributor to failure, e.g., the lower voltage at usage will result in a lower accumulated failure rate. Comparing FIGS. 8 and 9, it is seen that a change in beta has a more significant effect than a change in voltage.

Figure 10:
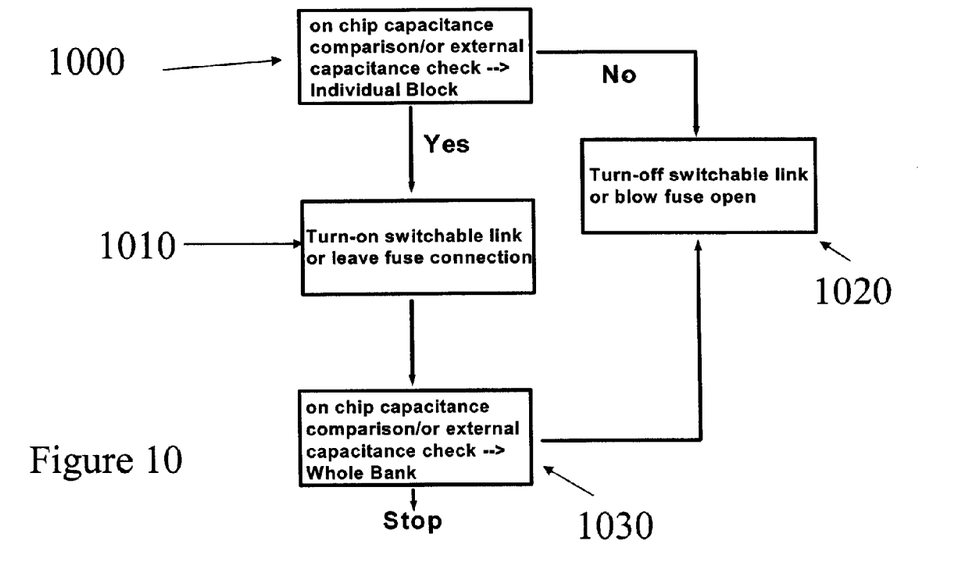
FIG. 10 is a flow diagram illustrating a test flow in accordance with the invention.

FIG. 10 is a flow diagram illustrating a test flow in accordance with the invention. In block 1000, an on chip capacitance comparison or external capacitance check is made for individual VPP blocks. In block 1010, all links or fuses are connected to VPP blocks through a top bus to form a large VPP bank. In block 1020, the switchable link is turned off or the fuse is blown open if a bad VPP block is found. In step 1030, a comparison of total capacitance (numbers of Vpp block*$C_{vpp}$) to a target value is made. If the total capacitance and target value are not the same, the process will trim parallel connected back-up VPP blocks out (reduction) or serial connected back-up banks (addition). If the total capacitance and the target value are matched, the process will stop. By using the flow of FIG. 10, an ideal VPP block design with optimized yield and connected with common bottom bus is achievable.

While the invention has been described in terms of various embodiments, those skilled in the art will recognize that the invention can be practiced with modification and still remain within the spirit and scope of the appended claims.

What is claimed:

1. A programmable passive device, comprising:
    a common bus, a second bus, and a third bus;
    a plurality of passive device elements comprising at least a first bank of the passive device elements and a second bank of the passive device elements each electrically coupled to the common bus, wherein the plurality of passive device elements are on-chip complimentary metal oxide semiconductor (CMOS) device elements; and
    a plurality of switches comprising a first subset of switches and a second subset of switches, the first subset of switches being electrically coupled to the second bus and selectively coupled to a number of the plurality of passive device elements of the first bank, the second subset of switches being electrically coupled to the third bus and selectively coupled to a number of the plurality of passive device elements of the second bank,
    wherein the second bus is directly connected to a first pad, the third bus is directly connected to a second pad, and the common bus is electrically connected to a third pad;
    the first bank of the passive device elements is connected to the second bus by a respective switch of the first subset of switches, and the second bank of the passive device elements is connected to the third bus by a respective switch of the second subset of switches;
    the first pad is configured to be grounded while the second pad is biased to create a capacitance configuration of a serial connection;
    the third pad is configured to be grounded while the first pad and the second pad are biased in order to create the capacitance configuration of a parallel connection;

a capacitance value of the passive device is programmable by biasing and grounding respective ones of the first pad, the second pad, and the third pad in order to achieve the capacitance configuration of the serial connection or the parallel connection between the first bank and the second bank of the passive device elements; and the plurality of switches include an e-fuse or an anti-fuse, wherein the e-fuse is programmed to open at a first bias and the anti-fuse is programmed to close at a second bias higher than the first bias such that the plurality of switches offers a second time programmability.

2. The programmable passive device of claim 1, wherein the plurality of passive device elements are capacitors.

3. The programmable passive device of claim 1, wherein the plurality of passive device elements are inductors or resistors.

4. The programmable passive device of claim 1, wherein the plurality of passive device elements comprise small surface area vertical parallel plate (VPP) capacitors.

5. The programmable passive device of claim 4, wherein the small area VPP capacitors provide a capacitance value equivalent to a single larger area capacitor.

6. The programmable passive device of claim 1, wherein the plurality of switches are TaN or Tungsten Nitride.

7. The programmable passive device of claim 1, wherein the plurality of passive device elements are stacked.

8. The programmable passive device of claim 1, wherein:
the first bank and the second bank are connected in the capacitance configuration of the serial connection;
a third bank and fourth bank are connected in the capacitance configuration of the parallel connection; and
the connections between the third bank and the fourth bank are made via the e-fuse.

9. The programmable passive device of claim 8, wherein a capacitance value of the first bank is equal to a capacitance value of the second bank.

10. A programmable passive device, comprising:
a common node;
at least two further nodes;
a first bank of passive device elements electrically coupled to the common node;
a second bank of passive device elements electrically coupled to the common node, wherein the first bank of passive device elements and the second bank of passive device elements comprise on-chip complimentary metal oxide semiconductor (CMOS) device elements; and
a plurality of switches associated with each of the passive device elements of the first bank and the second bank, the plurality of switches selectively coupling at least one of the passive device elements of at least one of the first bank to a first one of the at least two further nodes and selectively coupling at least one of the passive device elements of the second bank to a second one of the at least two further nodes,
wherein the first one of the at least two further nodes is directly connected to a first pad, the second one of the at least two further nodes is directly connected to a second pad, and the common node is electrically connected to a third pad;
the first pad is configured to be grounded while the second pad is biased to create a capacitance configuration of a serial connection;
the third pad is configured to be grounded while the first pad and the second pad are biased in order to create the capacitance configuration of a parallel connection; and
a capacitance value of the device is programmable by biasing and grounding respective ones of the first pad, the second pad and the third pad in order to achieve the capacitance configuration of the serial connection or the parallel connection between the first bank and the second bank of the passive device elements, wherein:
the first bank of passive device elements and the second bank of passive device elements comprise small surface area vertical parallel plate (VPP) capacitors;
at least one of the passive device elements of one of the first bank and the second bank is a different size with respect to other passive device elements; and
the plurality of switches include an e-fuse or an anti-fuse, wherein the e-fuse is programmed to open at a first bias and the anti-fuse is programmed to close at a second bias higher than the first bias such that the plurality of switches offers a second time programmability.

11. A method, comprising:
connecting VPP blocks through a top bus to form a VPP bank;
providing a chip capacitance comparison or external capacitance check for individual VPP blocks of the VPP bank;
turning off or blowing a fuse when a bad VPP block is found;
comparing a total capacitance of the VPP bank to a target value, wherein the comparing the total capacitance of the connected VPP bank to the target value is performed separately from the providing the chip capacitance comparison or external capacitance check for individual VPP blocks of the VPP bank; and
when the total capacitance and target value are not the same, trimming parallel connected back-up VPP blocks out or serial connected back-up banks,
wherein:
the VPP blocks comprise a plurality of passive device elements comprising a first bank of the passive device elements and a second bank of the passive device elements each electrically coupled to a common bus;
a first subset of switches is electrically coupled to a second bus and selectively coupled to a number of the plurality of passive device elements of the first bank;
a second subset of switches is electrically coupled to a third bus and selectively coupled to a number of the plurality of passive device elements of the second bank;
the second bus is directly connected to a first pad, the third bus is directly connected to a second pad, and the common bus is electrically connected to a third pad;
the first pad is configured to be grounded while the second pad is biased to create a capacitance configuration of a serial connection;
the third pad is configured to be grounded while the first pad and the second pad are biased in order to create the capacitance configuration of a parallel connection;
a capacitance value of the passive device is programmable by biasing and grounding respective ones of the first pad, the second pad, and the third pad in order to achieve the capacitance configuration of the serial connection or the parallel connection between the first bank and the second bank of the passive device elements;
at least one of the first subset of switches and the second subset of switches include an e-fuse or an anti-fuse; and
the e-fuse is programmed to open at a first bias and the anti-fuse is programmed to close at a second bias higher than the first bias such that the at least one of the first subset of switches and the second subset of switches offers a second time programmability.

12. The method of claim 11, wherein the first bank and the second bank are stacked together to share a total applied electrical field such that an electrical field applied to the first bank is divided and an electrical field applied to the second bank is divided.

13. A programmable passive device, comprising:
a common bus, a second bus, and a third bus;
a plurality of passive device elements comprising at least a first bank of the passive device elements and a second bank of the passive device elements each electrically coupled to the common bus, wherein the plurality of passive device elements are on-chip complimentary metal oxide semiconductor (CMOS) device elements; and
a plurality of switches comprising a first subset of switches and a second subset of switches, the first subset of switches being electrically coupled to the second bus and selectively coupled to a number of the plurality of passive device elements of the first bank, the second subset of switches being electrically coupled to the third bus and selectively coupled to a number of the plurality of passive device elements of the second bank,
wherein the common bus is electrically connected to a first pad, the second bus is directly connected to a second pad, and the third bus is directly connected to a third pad;
the first bank of the passive device elements is connected to the second bus by a respective switch of the first subset of switches, and the second bank of the passive device elements is connected to the third bus by a respective switch of the second subset of switches;
the second pad and the second bus are configured to be biased while the third pad and the third bus are grounded to create a capacitance configuration of a serial connection;
the first pad and the common bus are configured to be grounded while the second pad and the second bus and the third pad and the third bus are biased in order to create the capacitance configuration of a parallel connection;
a capacitance value of the passive device is programmable by biasing and grounding respective ones of the first pad and the common bus, the second pad and the second bus, and the third pad and the third bus in order to achieve the capacitance configuration of the serial connection or the parallel connection between the first bank and the second bank of the passive device elements;
the plurality of passive device elements comprise small surface area vertical parallel plate (VPP) capacitors;
the plurality of passive device elements are stacked; and
the plurality of switches include an e-fuse or an anti-fuse, wherein the e-fuse is programmed to open at a first bias and the anti-fuse is programmed to close at a second bias higher than the first bias such that the plurality of switches offers a second time programmability.

14. The programmable passive device of claim 1, wherein:
at least one of the plurality of switches is the e-fuse and the anti-fuse arranged in parallel, and the e-fuse is programmed to open at the first bias and the anti-fuse is programmed to close at the second bias higher than the first bias;
the common bus is electrically connected to the first pad, the second bus is directly connected to the second pad without any intervening structure therebetween, and the third bus is directly connected to the third pad without any intervening structure therebetween; and the plurality of passive device elements comprise stacked small surface area vertical parallel plate (VPP) capacitors.

15. The programmable passive device of claim 13, wherein the programmable passive device is configured based on the following equations:

$$\beta_k = k * \beta_1$$

$$S = k \ln(A_s/A_p)$$

$$t_{63-use} = (t_{63-1st} + t_{k-delay}) \times e^{[\gamma(V_{stress} - V_{use}/k)]} t_{63-use} = (t_{63-1st} + t_{k-delay}) \times e^{[\gamma(V_{stress} - V_{use}/k)]}$$

$\beta_k$ is a fail point distribution;
k is a number of the stacked VPP capacitors;
$\beta_1$ is a time of failure for a single VPP capacitor;
S is an area scaling,
$A_s$ is a total area of a stressed VPP capacitor;
$A_p$ is a total area of a real product;
$t_{63-use}$ is a median time to fail at usage conditions;
$t_{63-1st}$ is a time to fail for a first and last VPP capacitor in a stack;
$t_{k-delay}$ is a time to fail based on a delay;
$\gamma$ is a voltage acceleration factor;
$V_{stress}$ is voltage at stress level; and
$V_{use}$ is voltage at use condition.

16. The programmable passive device of claim 1, wherein:
at least one of the plurality of switches is the e-fuse and the anti-fuse arranged in parallel, and the e-fuse is programmed to open at the first bias and the anti-fuse is programmed to close at the second bias higher than the first bias;
the common bus is electrically connected to the first pad, the second bus is directly connected to the second pad without any intervening structure therebetween, and the third bus is directly connected to the third pad without any intervening structure therebetween;
the plurality of passive device elements comprise stacked small surface area vertical parallel plate (VPP) capacitors;
the programmable passive device is configured based on the following equations:

$$\beta_k = k * \beta_1$$

$$S = k \ln(A_s/A_p)$$

$$t_{63-use} = (t_{63-1st} + t_{k-delay}) \times e^{[\gamma(V_{stress} - V_{use}/k)]} t_{63-use} = (t_{63-1st} + t_{k-delay}) \times e^{[\gamma(V_{stress} - V_{use}/k)]}$$

$\beta_k$ is a fail point distribution;
k is a number of the stacked VPP capacitors;
$\beta_1$ is a time of failure for a single VPP capacitor;
S is an area scaling,
$A_s$ is a total area of a stressed VPP capacitor;
$A_p$ is a total area of a real product;
$t_{63-use}$ is a median time to fail at usage conditions;
$t_{63-1st}$ is a time to fail for a first and last VPP capacitor in a stack;
$t_{k-delay}$ is a time to fail based on a delay;
$\gamma$ is a voltage acceleration factor;
$V_{stress}$ is voltage at stress level; and
$V_{use}$ is voltage at use condition.

* * * * *